(12) United States Patent
Bates et al.

(10) Patent No.: US 8,078,933 B2
(45) Date of Patent: Dec. 13, 2011

(54) DECODER FOR LOW-DENSITY PARITY-CHECK CONVOLUTIONAL CODES

(75) Inventors: Stephen Bates, Edmonton (CA); Christian Schlegel, Edmonton (CA); Bruce Cockburn, Edmonton (CA); Vincent Gaudet, Edmonton (CA)

(73) Assignee: The Governors of the University of Alberta, Edmonton, Alberta (CA)

( * ) Notice: Subject to any disclaimer, the term of this patent is extended or adjusted under 35 U.S.C. 154(b) by 1064 days.

(21) Appl. No.: 11/914,337

(22) PCT Filed: Dec. 14, 2005

(86) PCT No.: PCT/US2005/045183
§ 371 (c)(1),
(2), (4) Date: Nov. 13, 2007

(87) PCT Pub. No.: WO2006/124071
PCT Pub. Date: Nov. 23, 2006

(65) Prior Publication Data
US 2008/0195913 A1    Aug. 14, 2008

Related U.S. Application Data

(60) Provisional application No. 60/682,178, filed on May 18, 2005.

(51) Int. Cl.
*H03M 13/00* (2006.01)

(52) U.S. Cl. ......... 714/752; 714/758; 714/794; 714/801
(58) Field of Classification Search .............. 714/752, 714/758, 794, 801
See application file for complete search history.

(56) References Cited

U.S. PATENT DOCUMENTS

2003/0104788 A1* 6/2003 Kim ........................... 455/67.3
2009/0070659 A1* 3/2009 Zhong et al. ................. 714/801

\* cited by examiner

*Primary Examiner* — Sam Rizk
(74) *Attorney, Agent, or Firm* — Withrow & Terranova, P.L.L.C.

(57) ABSTRACT

Decoder for low-density parity check convolutional codes. In at least some embodiments, a decoder (200) for arbitrary length blocks of low-density, parity-check codes includes a plurality of interconnected processors (202), which further include a plurality of interconnected nodes. A memory can be interconnected with the nodes to store intermediate log likelihood ratio (LLR) values based on channel LLR values. Thus, LLR values having successively improved accuracy relative to the channel LLR values can be output from each processor, and eventually used to decision information bits. In some embodiments, the memory is a random access memory (RAM) device that is adapted to store the intermediate LLR values in a circular buffer. Additionally, a storage device such as a read-only memory (ROM) device can be used to generate a predetermined plurality of addresses for reading and writing LLR values.

32 Claims, 8 Drawing Sheets

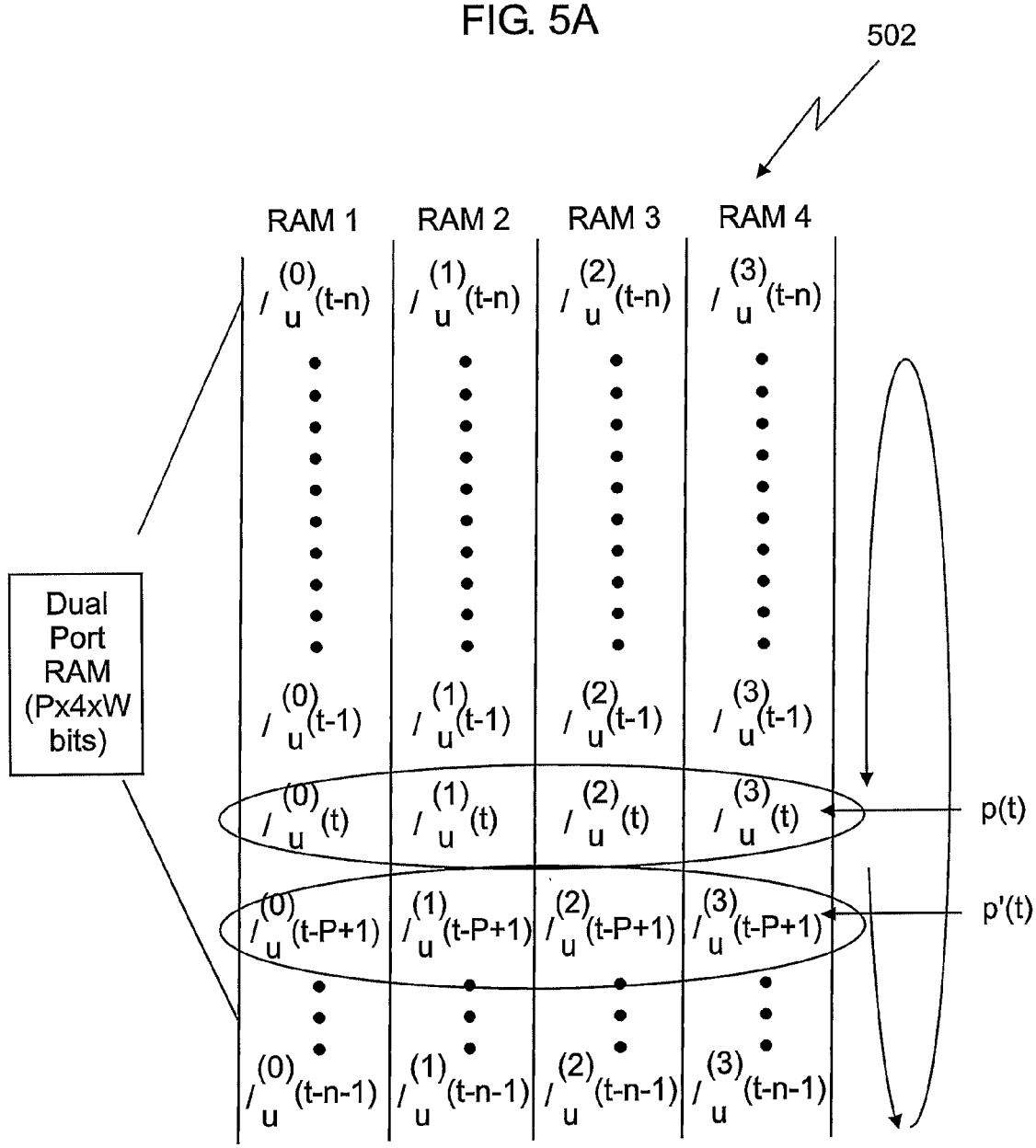

US 8,078,933 B2

DECODER FOR LOW-DENSITY PARITY-CHECK CONVOLUTIONAL CODES

BACKGROUND ART

There has been a lot of interest in low-density parity check block codes (LDPC-BCs) in recent years, primarily due to the efficiency of the codes and the ability to decode them with relatively simple circuits. Larger and faster LDPC-BC encoder and decoder implementations can be devised to meet the ever-increasing demands of modern telecommunication systems. However, many of today's wireline and wireless communication systems are packet or frame based, such as those based on Ethernet communication protocols. Applying LDPC-BCs to such systems presents several challenges. For example, how does one accommodate the random Ethernet frame size within a fixed LDPC-BC block size? What happens if an Ethernet frame to be transmitted is just slightly larger than an integer multiple of the block size? How are the LDPC-BC blocks to be delimited at the decoder so that it can synchronize with the encoder?

Low-density parity-check convolutional codes (LDPC-CCs) address some of these challenges by combining the advantages of LDPC-BCs with the ability to encode and decode arbitrary lengths of data. Another advantage of LDPC-CCs is that encoding and decoding can be done from a known state. This capability can greatly reduce the probability of an error over the first bytes of a frame, which is where important information is located with some protocols. However, at least some current architectures for LDPC-CC decoders tend to be register-intensive and as such are not optimal for FPGA and similar semiconductor implementations.

DISCLOSURE OF INVENTION

Embodiments of the present invention provide a memory-based decoder architecture for low-density parity-check convolutional codes. This architecture can be more efficient than register based decoders. In at least some embodiments, the decoder of the invention implements a belief propagation algorithm. Additionally, in some embodiments, the decoder architecture can be readily adapted to modifications in the codes being by making only minor changes to the architecture, such as changing the values stored in a read-only memory (ROM) device.

In at least some embodiments, a decoder for information bits represented by arbitrary length blocks of low-density, parity-check codes can include a plurality of interconnected processors. The processors can further include a plurality of interconnected nodes. A memory can be interconnected with the plurality of interconnected nodes. In some embodiments, the memory is adapted to store intermediate log likelihood ratio (LLR) values based on channel LLR values representing the low-density, parity-check codes. Thus, LLR values having successively improved accuracy relative to the channel LLR values can be output from each processor. LLR values can then be output from the final processor to be used to decision the information bits.

In some embodiments, information is decoded through means of a decoder circuit like that described above by passing LLR values representing the information through the processors. Each processor alternately passes each of the intermediate LLR values through a variable node and a parity-check node, at least in part by storing the intermediate LLR values in and retrieving the intermediate LLR values from the memory device. The accuracy of an LLR value keeps improving in this way, and eventually, the information bits can be accurately decisioned based on output LLR values.

In some embodiments, the memory is a random access memory (RAM) device that is adapted to store the intermediate LLR values in a circular buffer wherein a pointer can track a current position in the circular buffer. The RAM can be a multi-port RAM and can be partitioned or segmented. Additionally, in some embodiments, the plurality of interconnected nodes includes or consists of a plurality of variable nodes and a parity-check node operable to supply a parity-check output LLR value to the circular buffer. In some embodiments, the processors of the decoder can include a storage device to generate a predetermined plurality of addresses for reading and writing the intermediate LLR values. A read only memory (ROM) device can be used to implement this storage device.

BEST MODE(S) FOR CARRYING OUT THE INVENTION

Figure 1:
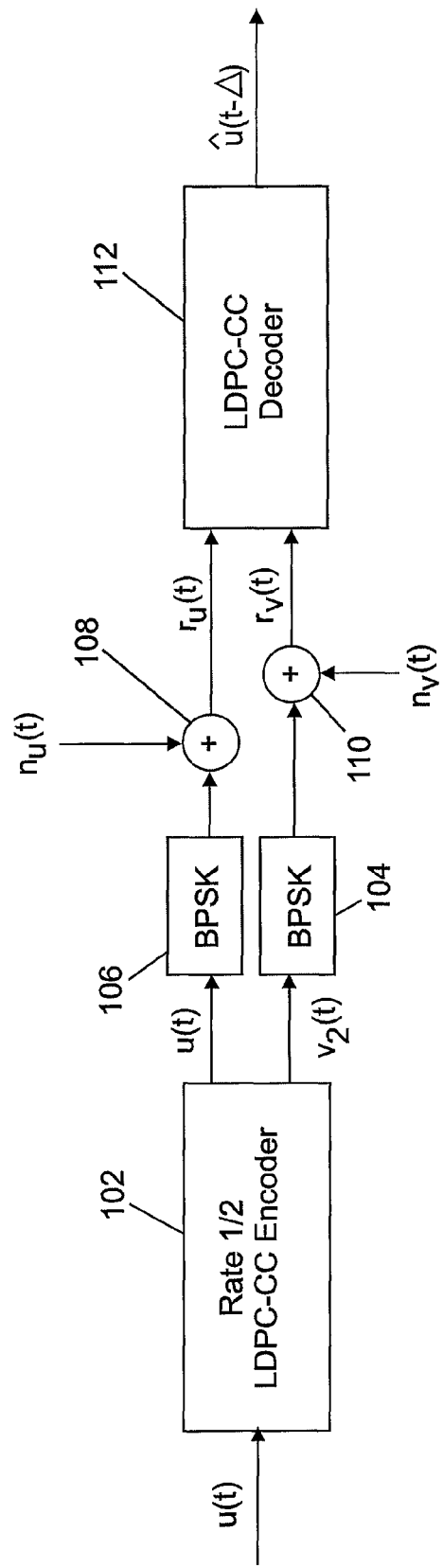
FIG. 1 is a block diagram of a channel model for a system with which the embodiments of the present invention can be used.

The present invention will now be described in terms of specific, example embodiments. It is to be understood that the invention is not limited to the example embodiments disclosed. It should also be understood that not every feature of the devices or methods described is necessary to implement the invention as claimed in any particular one of the appended claims. Various elements, steps, processes, and features of various embodiments of the invention are described in order to fully enable the invention. It should also be understood that throughout this disclosure, where a method is shown or described, the steps of the method may be performed in any order or simultaneously, unless it is clear from the context that one step depends on another being performed first.

Most of the terminology used herein is used as would be commonly understood by those of skill in the encoding and decoding arts. For purposes of convenience, it can be assumed for the rest of this disclosure that, since the codes being discussed are all low density parity check codes, such codes may simply be referred to as block codes or convolutional codes, as the case may be. As previously mentioned, in example embodiments of the invention, these codes can be decoded with a known algorithm, called the belief propagation algorithm, where binary values which are called log likelihood ratios (LLR) are passed around the decoder in a predetermined way between two types of nodes within processors that make up a decoder. One type of node can be referred to as a variable node, and the other can be referred to as a parity check node, parity node, or simply a check node.

The term "processor" as referred to herein is not necessarily intended to invoke a microprocessor as is understood in the computing arts. Rather, this known term has been coined for a mathematical construct in the coding arts. Each processor is an independent structure that can contain any of a variety of circuits to pass LLR values through variable and parity nodes. These structures, and in fact an entire decoder, can be implemented by microprocessors in the traditional sense, as well as in software, digital hardware logic, or in any other fashion. The present invention, embodied as a decoder using memory to store intermediate LLR values, has been conveniently implemented using a field-programmable gate array, but the invention is by no means limited to such an implementation.

It should also be noted that although the example embodiments of the invention are disclosed and discussed in terms of a decoder for LDPC-CC's, an encoder is necessarily needed to create the codes before there are any LDPC-CC's to decode. Thus, a device that embodies the invention might be thought of in context as an encoder, decoder, or an encoder/decoder. Likewise, a decoder according to the invention can be combined with an encoder in various ways, or operate as a stand-alone device. The term decoder as used herein may encompass all of these possibilities.

It would be helpful to first go over some background information on LDPC-CC's. LDPC convolutional codes are similar to LDPC block codes in that they generate code bits based on a low-density parity check matrix. However, convolutional codes differ from block codes in that any given code-bit is generated using only previous information bits and previously generated code-bits. This difference implies that the generator matrix for convolutional codes is inherently lower triangular and this implication simplifies the encoding process and reduces encoding latency. LDPC-CCs are defined by their infinite, but periodic, parity-check matrix H. For a rate $\frac{1}{2}$ code, an information sequence:

$$u(0,t)=[u(0),u(1),\ldots,u(t)],$$

is encoded into a sequence:

$$v(0,t)=[v_1(0),v_2(0),v_1(1),v_2(1),\ldots,v_1(t),v_2(t)],$$

such that:

$$v(0,t)H_{[0,t]}^T=0,$$

where $H_{[0,t]}$ is a suitably chosen section of the infinite matrix, H, and has the form:

$$H_{[0,t]}^T = \begin{bmatrix} h_1^{(0)}(0) & h_1^{(1)}(1) & \cdots & h_1^{m_s}(m_s) & 0 & \cdots & 0 \\ h_2^{(0)}(0) & h_2^{(1)}(1) & \cdots & h_2^{(m_s)}(m_s) & 0 & \cdots & 0 \\ 0 & h_1^{(0)}(1) & \cdots & \vdots & h_1^{m_s}(m_s+1) & \cdots & 0 \\ \vdots & h_2^{(0)}(1) & \cdots & & h_2^{m_s}(m_s+1) & \cdots & 0 \\ & 0 & \ddots & & \vdots & & \vdots \\ & & \ddots & & & & 0 \\ & & & & & & h_1^{m_s}(t) \\ & & & & & & h_2^{m_s}(t) \\ & & & & & & \vdots \\ & & & & & 0 & h_2^{(0)}(t) \end{bmatrix}.$$

Note that $h_i^{(j)}(n) \in \{0,1\}$ and $h_2^{(0)}(n)=1$ where $0 \leq n \leq t$. For purposes of this disclosure it can be assumed that the number of ones in each row of H, denoted K, and the number of ones in each column of H, denoted J, are constant. There are obviously a large number of potential convolutional codes available based on the above.

The parameter $m_s$ specifies the memory of the convolutional code. The bit error rate (BER) performance of well-designed convolutional codes increases with the memory, but so too does the encoder and decoder complexity. Another parameter of the code is the period of the repeating section within H. For purposes of the embodiments disclosed herein only codes with a period of $m_s+1$ are considered, for example:

$$h_i^{(j)}(t)=h_i^{(j)}(t+m_s+1).$$

An LDPC-CC of this form therefore consists of ms+1 phases and the phase at any given time is denoted $\phi(t)$, which implies that encoding and decoding circuits also have a periodic behavior that is controlled by $\phi(t)$. For purposes of the example embodiments disclosed herein, it can be assumed that $\phi(t)=t \mod(m_s+1)$.

The encoded sequence for a rate $\frac{1}{2}$ systematic LDPC-CC can be determined as follows:

$$v_1(t) = u(t),$$

$$v_2(t) = \sum_{i=0}^{m_s} h_1^{(i)}(t)u(t-i) + \sum_{i=1}^{m_s} h_2^{(i)}(t)v_2(t-i),$$

where we assume $u(t)=0 \forall t<0$. Hence $v_2(t)$ is generated by an XOR operation upon a number of the $m_s+1$ most recent information bits and the $m_s$ most recent code bits. Therefore, an LDPC-CC encoder can be constructed in a straightforward manner from delay-lines, multiplexers, and one or more XOR gates.

Turning to a decoder according to example embodiments of the present invention, FIG. 1 illustrates the channel model used to develop the decoder embodiments disclosed herein. The data is encoded at by a rate $\frac{1}{2}$ LDPC-CC encoder 102. The systematic encoder output bit, u(t), and the code-bit, $v_2(t)$, are encoded using binary phase shift keying (BPSK), 104 and 106, onto two independent channels at a rate of one code-symbol per baud-period. Additive white Gaussian noise (AWGN) is added at 108 and 110 such that, at time t, the two receive values are given by:

$$r_u(t)=1-2u(t)+n_u(t),$$

and $$r_v(t)=1-2v_2(t)+n_v(t).$$

It can be assumed that the AWGN on the two channels are from identical distributions and that $n_u(t)$ and $n_v(t)$ are uncorrelated. The two receive values can be passed into decoder 112 according to example embodiments of the invention, which produces an estimate of the transmitted information bit sometime ago, $\hat{u}(t-\Delta)$.

Figure 2:
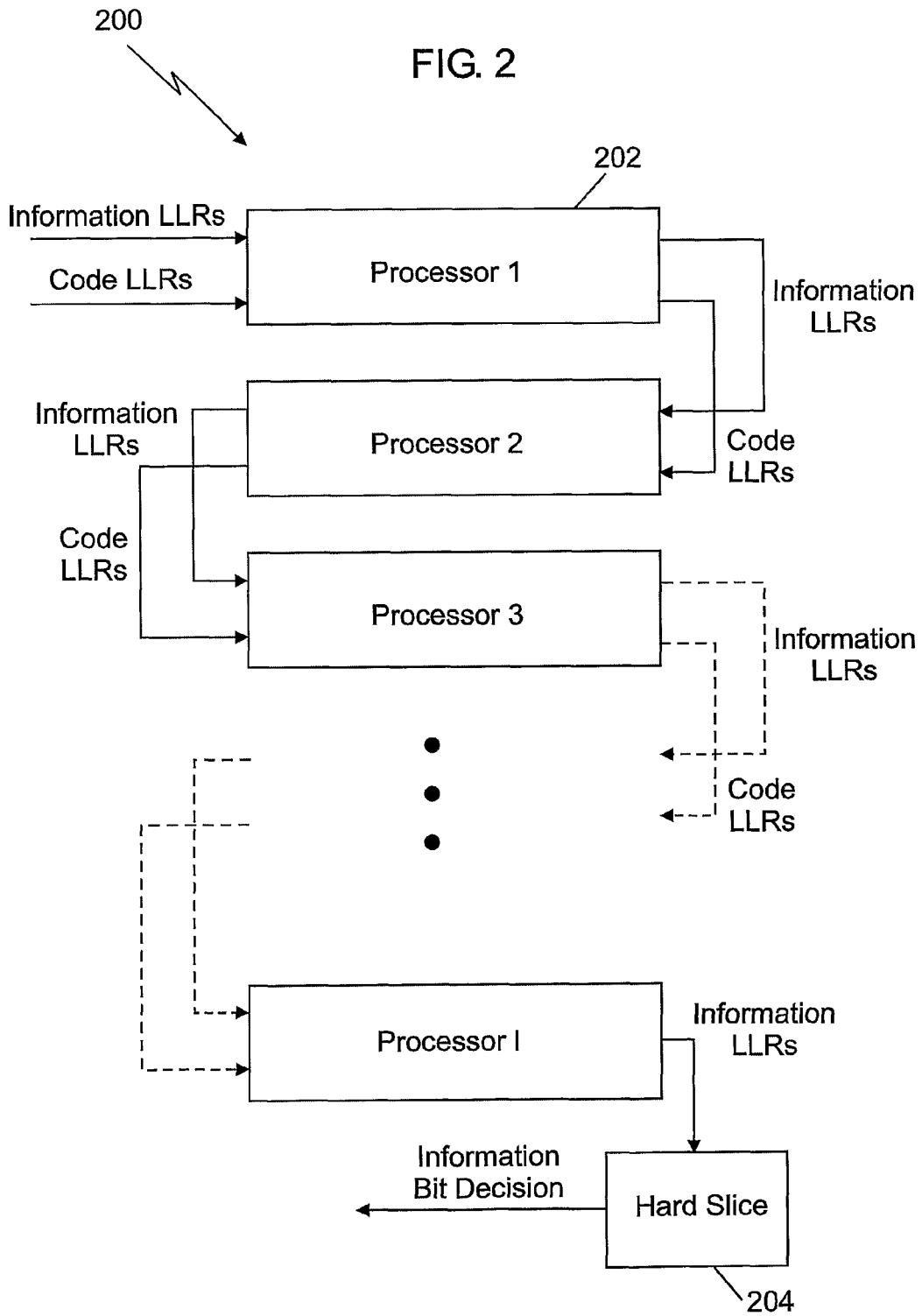
FIG. 2 is a functional block diagram of a decoder according to example embodiments of the invention.

FIG. 2 illustrates an LDPC-CC decoder, 200, according to example embodiments of the invention. This decoder is constructed as the concatenation of multiple, identical processors 202, designated Processor 1, Processor 2, etc., up until the last processor, Processor I. The detailed architecture of these processors will be discussed below with respect to FIGS. 3, 4 and 5. The information bit and code-bit have been encoded using BPSK onto two independent dimensions, as illustrated by the two paths through decoder 200. The belief-propagation (BP)

algorithm is used. Each processor consists of storage elements, a single check node and a number of variable nodes. This replication of identical processors makes the decoder well-suited to ASIC and FPGA implementations. One processor can be tiled as many times as required to meet performance objectives or as permitted by die size or FPGA resource constraints.

The BP algorithm, implemented by the processors of FIG. 2, operates on log-likelihood ratio (LLR) values that are related to the probability of a given receive value being related to the transmission of a logical one or zero. For a $(m_s,3,6)$ convolutional code, one information LLR and one code LLR are required from the channel per baud-period. These two LLR's are denoted $l_u^{(0)}(t)$ for the information LLR and $l_v^{(0)}(t)$ for the code LLR. These two LLR's are related to the receive values by the equation:

$$l_u^{(0)}(t) = \frac{4KE_b r_u(t)}{JN_0},$$

and $$l_v^{(0)}(t) = \frac{4KE_b r_v(t)}{JN_0},$$

where $E_b$ is the energy per bit and $$\frac{N_0}{2}$$

is the power of the noise.

For purposes of this disclosure, LLR's other than channel LLR's and the final LLR's from processor I are referred to as intermediate LLR values. It is these intermediate LLR's that are altered when they pass through the nodes of each processor of a decoder like that shown in FIG. 2. Processor I of FIG. 2, outputs for each bit, a final information LLR to hard slice block 204, which decisions an information bit from each LLR value.

It will aid the reader in understanding the details of the processors of FIG. 2 to have an understanding of the basic operations that are performed by the parity check and variable nodes in a decoder according to example embodiments of the invention. For purposes of this discussion, intermediate LLR's are denoted $l_u^{(i)}(t)$, i>0 for the information LLR's and $l_v^{(i)}(t)$, i>0 for the code-bit LLR's. Turning first to the parity check node operation, within any processor, at any given baud-period, a parity-check node operates upon K intermediate LLR values and alters them to form K adjusted LLR values. If one of the parity-check node inputs, for processor p, at time, t is denoted, $l_i^{(i)}(t-\delta)$ then $(u, i, \delta) \in C_p(t)$ where $C_p(t)$ is the set of such indices for all K inputs. Then:

$$l_u^{(i)}(t-\delta) \to \tanh^{-1} \prod_{(y',i',\delta') \in C_p(t)/(u,i,\delta)} \tanh\left(\frac{l_{y'}^{(i')}(t-\delta')}{2}\right),$$

where $y' \in \{u, v\}$ and $i, i' \in \{1,2,3\}$. $C_p(t)/(u,i,\delta)$ denotes the subtraction of element $(u,i,\delta)$ from the set $C_p(t)$. Since the parity-check node operation given above is complex, some degree of approximation can be employed to simplify implementation. However, this approximation may compromise the performance of a decoder. One of ordinary skill in the art can implement an appropriate decoder for a given application taking these design considerations as well as the rest of this disclosure into account.

The elements of $C_p(t)$ can be determined by the phase, $\phi(t)$ and the locations of the ones in the relevant row of the parity-check matrix, H. For the (128,3,6) LDPC-CC considered in the example herein, two elements of $C_p(t)$ are fixed and are given by $(v,1,(p-1)m_s)$ and $(v,3,pm_s)$. For all t and p, three of the elements of $C_p(t)$ are associated with intermediate information LLR's and three are associated with intermediate code LLR's. The six outputs are adjusted intermediate LLR's and should be placed back into the LLR storage element in such a way as to overwrite the six corresponding inputs.

Turning to variable node operations, these are performed just before the LLR values leave a given processor. This corresponds to $m_s$ baud-periods after the corresponding LLR values arrived at the processor. A variable node operates upon all the information LLR's (or code LLR's) associated with a given baud-period. For the information LLR values the outputs of the variable node are given by:

$$l_u^{(i)}(t) \to \begin{cases} l_u^{(0)}(t) & \text{if } i = 0 \\ \sum_{j \neq i} l_j(t) & \text{otherwise} \end{cases},$$

for $i \in \{0, 1, 2, \ldots, J\}$.

Figure 3:
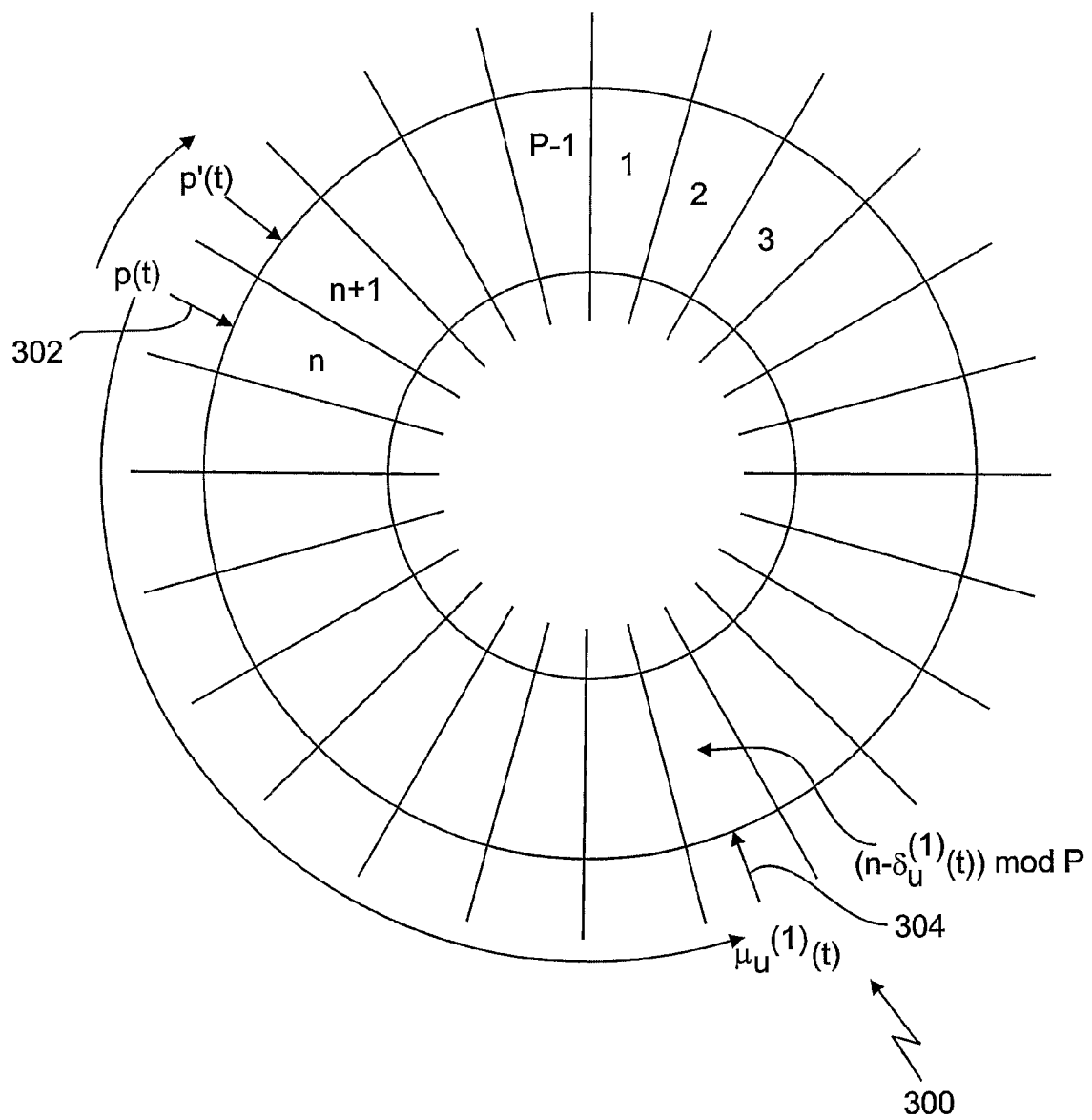
FIG. 3 is a conceptual diagram illustrating how intermediate LLR values can be stored in a circular buffer according to example embodiments of the invention.

Since most modern FPGA devices combine logic elements "LE's" with on-chip memory units to enable a variety of designs, embodiments of the decoder of the present invention use memory to store LLR values. In at least some embodiments, the memory implements a circular buffer and current position in the buffer being accessed is tracked using a pointer. This circular buffer can be implemented, as an example, using random access memory (RAM). A schematic illustration of an example circular buffer, 300, which can be configured RAM, is shown in FIG. 3. At any time, t, pointer 302, (p(t)), points to the present memory location. This pointer moves in a clockwise direction at the rate of one address per baud-period. The parity-check inputs are determined using the offsets contained within $C_p(t)$ as discussed above. In practice, these offsets can be stored in a read-only memory (ROM) of size $(K-2)m_s$ addresses. The K-2 term comes from the fact that two elements of $C_p(t)$ are constant.

The absolute address of a parity-check node input can be determined by performing subtraction and modulo operations upon the pointer and the offsets. An example of this type of calculation for $\mu_u^{(1)}(t)$ at 304 of FIG. 3 is:

$$\mu_u^{(1)}(t) = (p(t) - \delta_u^{(1)}(\phi(t))) \bmod P.$$

Note that the above equation takes advantage of the periodicity of $C_p(t)$.

As previously mentioned, the belief propagation algorithm involves passing LLR values between two types of nodes in the processors of the decoder. One of the nodes types is sometimes referred to as a variable node and the other is sometimes referred to as a check node, parity check node, parity node, or the like. In a typical processor, these node circuits are identical or nearly so. What distinguishes the two types of nodes is when and how each processes LLR values in the process of passing an LLR through a processor of a decoder. LLR's typically pass alternately between the two types of nodes some number of times as determined by the architecture of the processor, with the reliability of the information bit represented by the LLR improving each time the LLR is processed by a node. The circuit configuration of node circuits is known by those of skill in the decoding arts.

Figure 4:
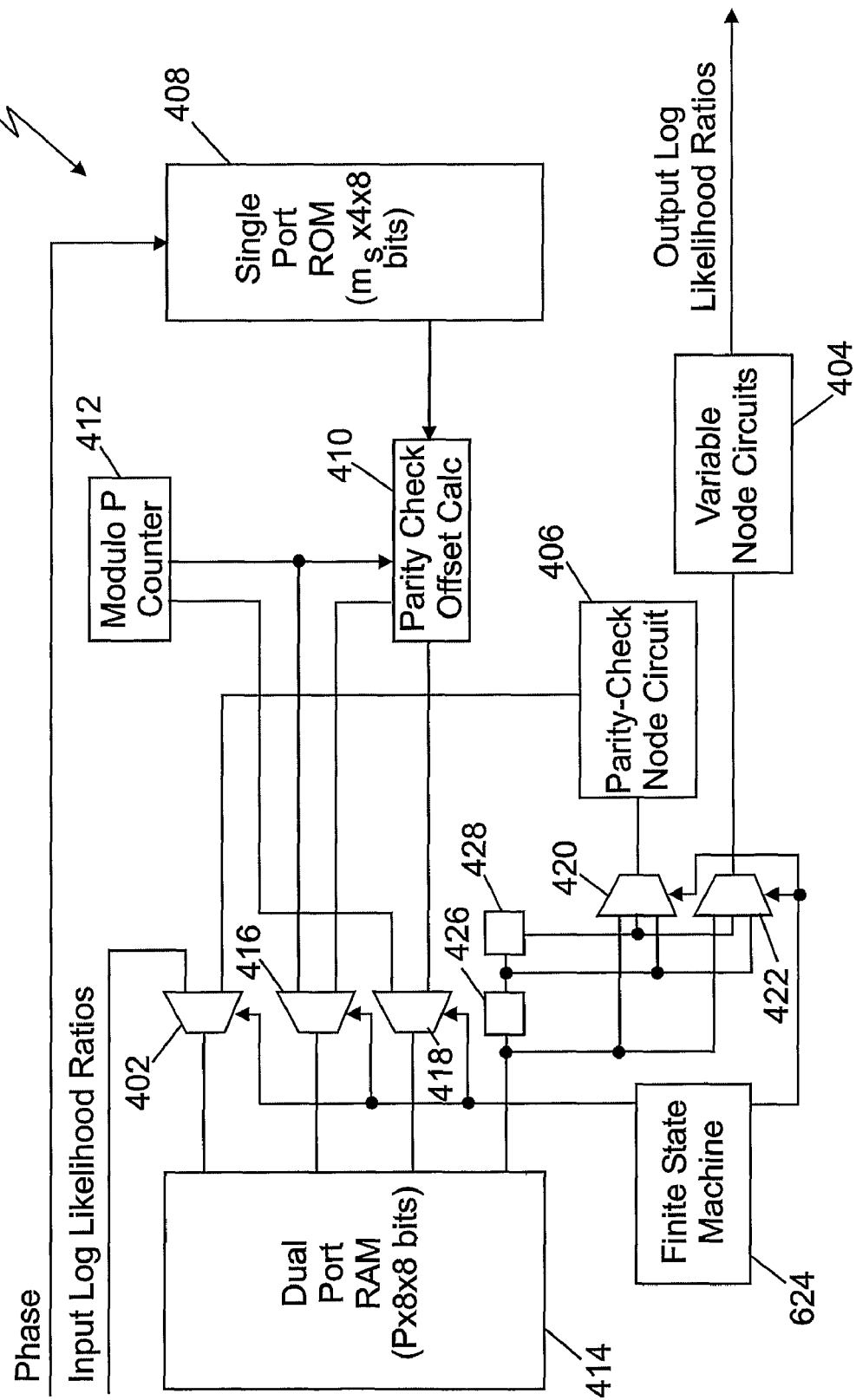
FIG. 4 is a schematic diagram illustrating the detail of one of the processors of the decoder of FIG. 2.
Figure 5B:
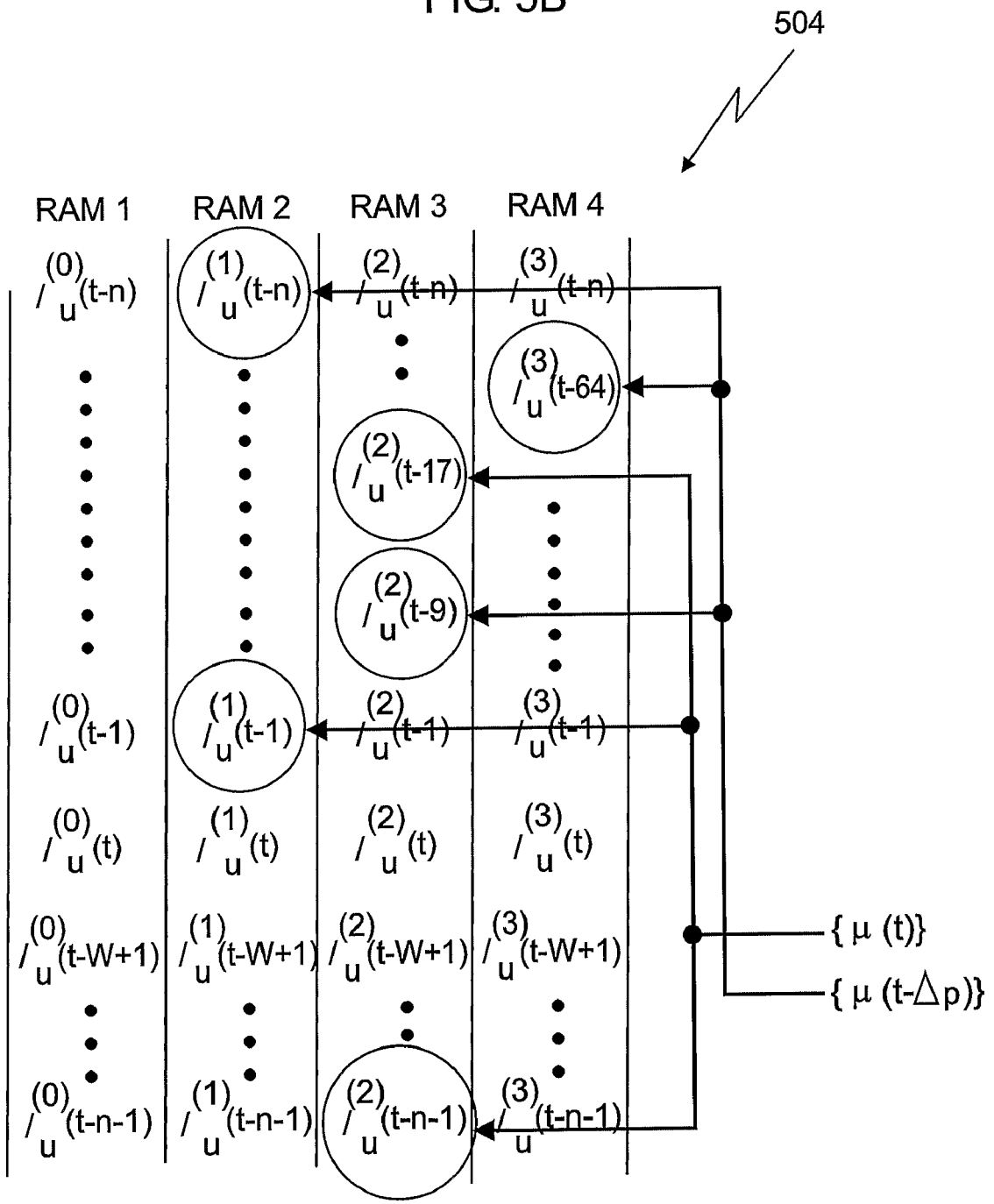
FIG. 5 is a conceptual diagram illustrating memory partitioning according to at least some embodiments of the invention. These are illustrated on two sheets as FIG. 5A and FIG. 5B.

A schematic block diagram of a memory-based processor architecture of a decoder using the belief propagation algorithm according to example embodiments of the present invention is shown in FIG. 4. The processor, 400, requires input LLR's and generates output LLR's. The input LLR's for the processor are received at multiplexer 402 and come from either the channel or from the previous processor. The outputs from the processor come from the variable node circuits, 404, and either go to the decision device or the next processor. At any given time, t, the address to which the input LLR's must be written is given by the pointer address, p(t). The output LLR's are the oldest LLR's in the buffer and they are therefore located at $p'(t)=(p(t)+1) \mod P$ where mod represents the modulo operator. The pointer can then be updated such that $p(t+1)=p'(t)$.

Still referring to FIG. 4 parity check node circuit 406 is supplied with LLR inputs from the circular buffer, and its outputs are written back into the circular buffer. For the regular (128,3,6) code used as an example herein 6 LLR's should be read from and written back to the parity node per baud-period. The exact location of these LLR's can be more complicated to determine than for the input and output LLR's, since location is a property of the code. Location is also relative to the current pointer location, p(t). Therefore, the needs to be a way to generates addresses for the circular buffer based on both the present phase, (t), and the pointer p(t). The single-port ROM, 408, ($m_s \times 4 \times 8$ bits) stores the six offset addresses per phase. Parity-check offset calculator block 410 generates the six absolute addresses, by subtracting the ROM addresses from p(t) modulo P using module P counter 412.

The circular buffer previously described resides in dual port RAM 414 of FIG. 4 ($P \times 8 \times 8$ bits). To reduce the number of read and write operations required per circular buffer in this embodiment, eight separate RAM's are implemented with independent devices or via segments within a single RAM device. The organization of the four RAM's associated with the information bit LLR's is illustrated schematically in FIG. 5. Each RAM has size P words and width W bits. For use in an FPGA implementation, it may be advantageous to choose the width to be a multiple of 8 bits. Hence in this example the LLR precision is set to W=8. The eight columnar RAM's store the J+1 information LLR's and J+1 code LLR's per baud-period from time t back to time t−P+1. In order to decode the LDPC-CC a certain number of operations must be performed on the circular buffers. The writing (reading) of the input (output) information LLR's is shown in phase 502 of FIG. 5A. Note that if the memory is dual-port that both read and write operations can be performed in a single clock cycle. LLR's output from the memory are then processed by the variable node before being output to the next processor in the decoder or to the decision device. The outputs of the parity-check node should be written back to the same address in the circular buffer that the inputs were read from. Therefore the addresses are stored in a delay line of length equal to the latency of the parity-check operation, p, at which point the addresses become the write addresses. That is, the addresses are read addresses at time t, and are write addresses at time t+p. The parity-check input read and output write operations are shown in phase 504 of FIG. 5B.

For the (128,3,6) LDPC-CC considered herein, a total of seven memory read operations and seven memory write operations per baud-period are needed. More generally, any ($m_s$,J,K) LDPC-CC will require 2(J+1)+K read and write operations per baud-period. Even with dual port memory, this large number of memory accesses will limit performance, unless some form of memory partitioning is implemented. The fact that all these memory operations are needed in a single baud-period suggests the use of a quad-port RAM or a clock to address the circular buffer which is twice the speed of the base clock for the processor circuitry. However a further complication exists. As can be seen in phase 502 of FIG. 5, any given parity-check read (write) operation many involve up to two reads (writes) of a given column of RAM. For example, in phase 504 of FIG. 5, memory bank RAM 3 is read twice. Therefore the worst case total number of reads (writes) required in a single baud-period can be up to three. Hence the clock driving the RAM circuitry is required operate at three times the baud-period. The throughput of the decoder is therefore limited to the lesser of the baud-period clock or one third of the clock that drives the memory.

Returning to FIG. 4, in order to coordinate the circular buffer operations multiplexers 416, 418, 420, and 422 are required in addition to previously mentioned multiplexer 402. The multiplexers assist in the transfer of memory addresses and read or write values from one clock domain to another. A simple state machine, finite state machine 424, inside the 3× clock domain, tracks the current operation required within the RAM and ensures that both the input/output LLR operations and parity-check operations are performed every baud-period. State machine 424 is also responsible for generating the select signals for the multiplexers. Registers 426 and 428 are clocked with the same signal that is used to clock the RAM.

It cannot be overemphasized that although the embodiment of the invention shown in FIGS. 4 and 5 uses RAM, any type of storage or memory device can serve as the memory for an embodiment of the invention. This functionality can be provided by devices in which all addresses cannot be accessed at the same time. If the memory is segmented as described above, full advantage of this segmentation can be realized by analyzing the structure of the code and realizing what parts of the code are independent from one another. The memory can then be segmented accordingly or multiple devices can be used.

At least some synthesis results suggest that a single target device implementing an example decoder according to the invention can accommodate 30 processors, given typical wiring and placement constraints. Using this information, an example of the architecture described herein has been constructed on an actual FPGA, and the results help illustrate some of the design trade-offs that might be considered by one of ordinary skill in the art who is implementing an embodiment of the invention. An Altera Stratix® DSP development board using a Stratix EP1S80 FPGA and on-board RAM and interfaces was used. A 30-processor decoder was implemented on the FPGA along with a test pattern generator and an AWGN generator. The Stratix device was provided with an 80 MHz clock from a crystal and an on-chip phase-locked loop (PLL) was used to generate synchronous 25 MHz and 75 MHz clocks.

Figure 6:
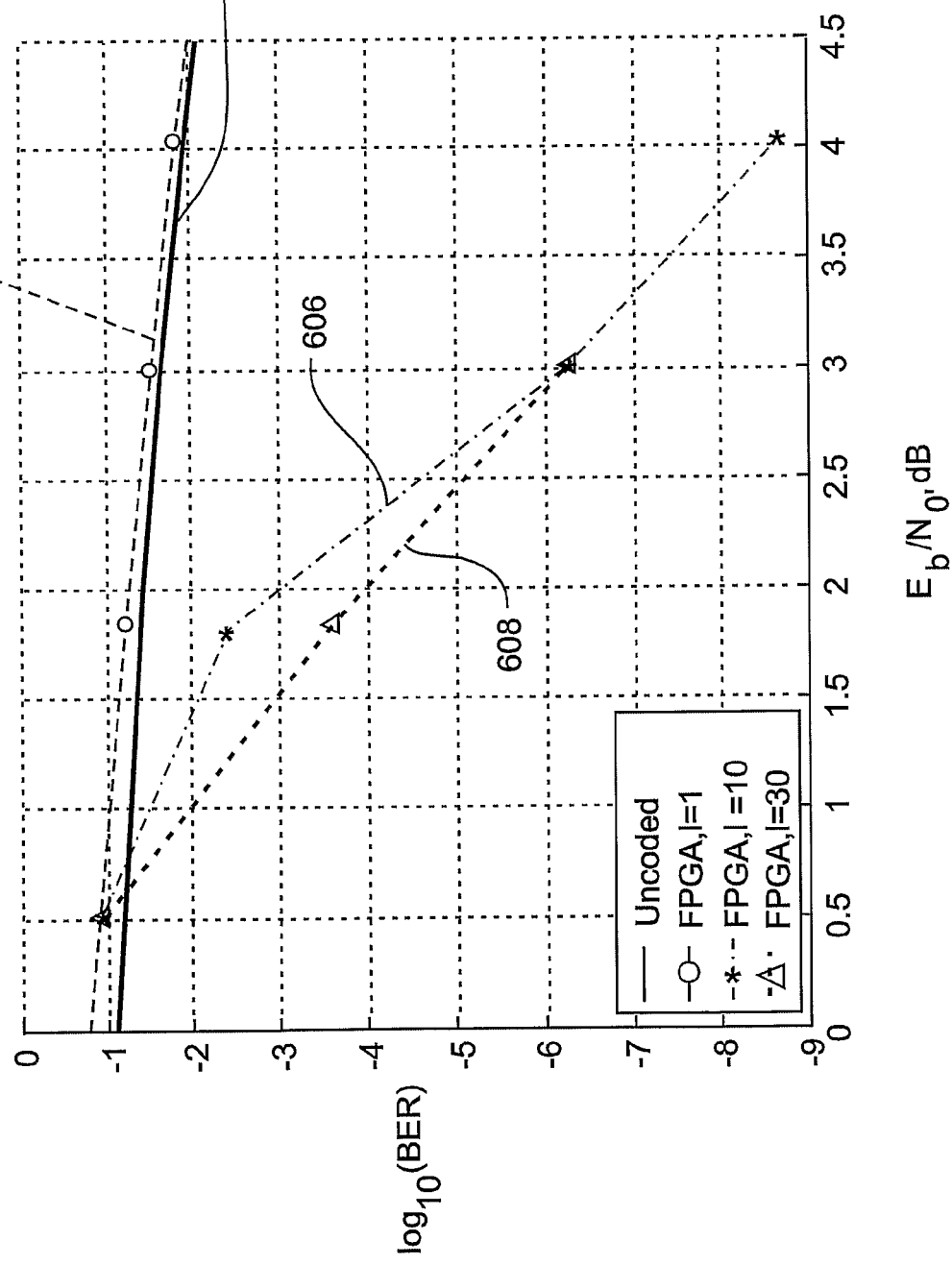
FIG. 6 shows a graph that illustrates the performance of example decoder implementations with different numbers of processors against data of varying error rates.

This realization was tested with varying numbers of processors enabled. The results for this decoder relative to noise $E_b/N_0$ in dB are shown in graph 600 of FIG. 6. Line 602 is for uncoded data. Line 604 illustrates performance for a one-processor decoder, line 606 for a ten-processor decoder, and line 608 for a thirty-processor decoder. For the case of a single processor the performance is very poor and is worse than the performance of uncoded data. This poor performance results because a single processor is unable to perform any significant amount of error correction. However both the ten and thirty processor decoders perform significant amounts of error correction. The differences between these results are at least partly due to the sign-minimum approximation in the parity node and finite-precision effects. Note that the error counter on the FPGA was only able to accurately determine error rates down to $1e^{-9}$. Therefore, all that is known about the BER of the thirty-processor decoder at 4.03 dB is that it is lower than this figure.

Figure 7:
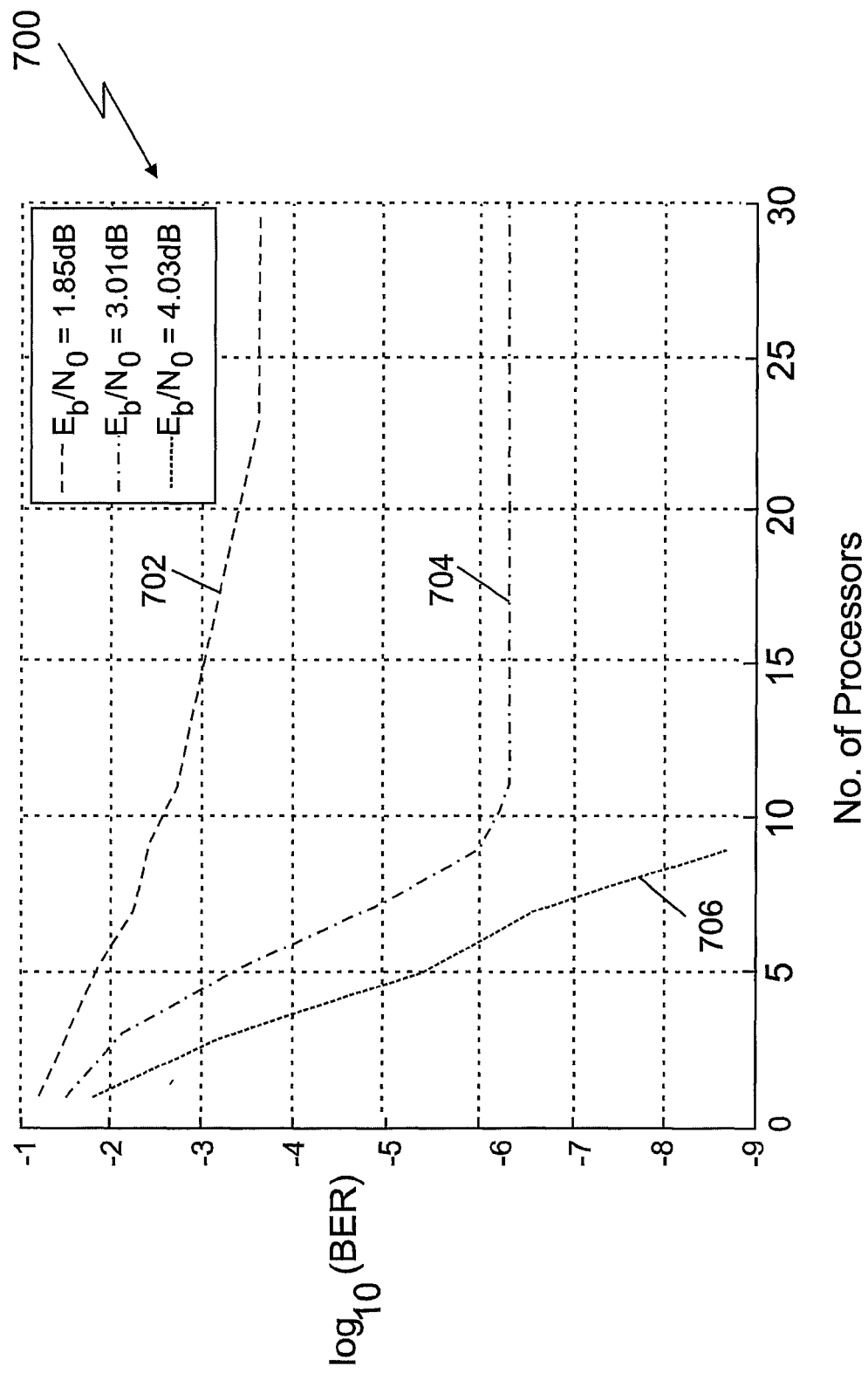
FIG. 7 shows a graph that illustrates how performance of an example decoder architecture varies according to the number of processors used.

Performance of an LDPC-CC decoder increases as the number of processors, until some limit is met. In FIG. 7 the BER versus number of processors is plotted for different levels of noise. In graph 700 curve 702 is for a noise level of 1.85 dB, curve 704 is for a noise level of 3.01 dB and curve 706 is for a noise level of 4.03 dB. It is clear that a significant increase in performance can be obtained at a noise level of 3.01 dB by adding processors until the device has ten processors. Beyond that, the performance gained by adding additional processors is minimal. A complete set of results could not be obtained for a noise figure of 4.03 dB due to limitations in the error detection circuitry used for testing. However for a device like that of the example embodiments discussed herein, if a target BER of greater than or equal to $1e^{-8}$ is set, then, only 10 processors are required. For a programmable device implemented with 30 processors, if each processor is a separate physical entity, it is possible to utilize the processors as three, 10-processor decoders operating in parallel. Such a device could operate upon three independent streams at the same time and thus provide for increased throughput. More generally, it is possible to use this architecture to implement an LDPC-CC decoder that can trade throughput for performance in a dynamic fashion. Such a decoder can vary numbers of processors to different encoded streams as BER and noise parameters vary.

For the example embodiments described herein, the memory-based architecture has been used on (128,3,6) codes. However, the architecture is insensitive to the choice of $m_s$ in the sense that only the dimensions of the storage elements need to change. The parity-check node and variable-node units can be identical, regardless of $m_s$. Since the period of H is $m_s+1$, the number of offsets will increase linearly with more complex codes and the size of the address into the ROM or other storage device may need to be increased. Another issue with increasing $m_s$ is that the number of processors required to achieve good BER performance tends to increase. This increase can be accommodated without increasing the physical number of processors by looping terminated LDPC-CC encoded data through the processors a number of times. If either J or K is altered then the processing nodes will have to be changed to accommodate the new number of inputs and outputs. In addition the number of memory accesses required per baud-period will also change. Increasing the number of memory accesses will lead to a decrease in throughput. The state machine that controls the memory accesses will also need to be modified. All of these modifications are within the typical skill of a practitioner in the encoding and decoding circuit arts.

It should also be noted that the use of an easily changeable storage device to generate addresses such as the ROM described herein can make it very practical to customize the processors of a decoder for variations in the coding. If a new code is developed that satisfies the same constraints as the example codes discussed herein, and it can be handled by the belief propagation algorithm, it may be able to be accommodated by merely changing the ROM or other storage device used for addressing. Thus, as more efficient codes are discovered, the architecture of the invention can be adapted to those codes.

It is well known that irregular LDPC-BC's can outperform regular LDPC-BC's. Irregular codes have processing node degrees that vary. Very little work has been done on designing irregular codes for LDPC-CC's but it is expected with they too will perform better than their regular counterparts. In that case one can apply the architecture of the present invention to irregular LDPC-CC's. For use with irregular codes, codes with a low peak-to-mean node degree may work better. In such a case, the processing nodes in the decoder can be designed for the worst-case degree and inputs and outputs can be disabled as required. The clock for the memory device will also be determined by the worst-case node degrees.

Specific embodiments of an invention have been herein described. One of ordinary skill in the coding arts will quickly recognize that the invention has numerous other embodiments. The following claims are in no way intended to limit the scope of the invention to the specific embodiments described.

The invention claimed is:

1. A processor to facilitate decoding of arbitrary length blocks of low-density, parity-check codes, the processor comprising:
    a plurality of interconnected nodes; and
    a memory interconnected with the plurality of interconnected nodes, the memory adapted to store intermediate log likelihood ratio (LLR) values based on channel LLR values representing the low-density, parity-check codes to enable outputting LLR values having improved accuracy relative to the channel LLR values;
    wherein the memory is adapted to store the intermediate LLR values in a circular buffer where a pointer tracks a current position in the circular buffer.

2. The processor of claim 1 wherein the memory further comprises a random access memory (RAM) device.

3. The processor of claim 2 wherein the RAM device further comprises multi-port RAM.

4. The processor of claim 3 further comprising a storage device to generate a predetermined plurality of addresses for reading and writing the intermediate LLR values.

5. The processor of claim 4 wherein the storage device comprises a read only memory (ROM) device.

6. The processor of claim 2 wherein the processor is further adapted to implement memory partitioning within the RAM device.

7. The processor of claim 6 further comprising a storage device to generate a predetermined plurality of addresses for reading and writing the intermediate LLR values to the RAM device.

8. The processor of claim 7 wherein the storage device comprises a read only memory (ROM) device.

9. The processor of claim 1 wherein the plurality of interconnected nodes further comprise:
    a plurality of variable nodes, at least one of the plurality of variable nodes operable to process an oldest intermediate LLR value from the circular buffer; and
    a parity-check node operable to supply a parity-check output LLR value to the circular buffer.

10. The processor of claim 1 wherein the pointer moves to a next address in the circular buffer at a rate of one address per buad period.

11. The processor of claim 1 wherein, at each time (t), the pointer defines an address in the circular buffer to which input LLR values for the processor at the time (t) are written.

12. The processor of claim 11 wherein the plurality of interconnected nodes further comprise a parity-check node adapted to:
    read, at a time (t), a plurality of input LLR values from a plurality of addresses in the circular buffer defined by a plurality of predefined offsets from the address in the circular buffer defined by the pointer at the time (t);

process the plurality of input LLR values to provide a plurality of adjusted LLR values; and write the plurality of adjusted LLR values back to the same plurality of addresses in the circular buffer.

13. A decoder for information bits represented by arbitrary length blocks of low-density, parity-check codes, the decoder comprising a plurality of interconnected processors, at least one of the plurality of interconnected processors further comprising:

a plurality of interconnected nodes; and a memory interconnected with the plurality of interconnected nodes, the memory adapted to store intermediate log likelihood ratio (LLR) values based on channel LLR values representing the low-density, parity-check codes to enable outputting LLR values having improved accuracy relative to the channel LLR values, wherein the memory is adapted to store the intermediate LLR values in a circular buffer where a pointer tracks a current position in the circular buffer;

wherein final LLR values from one of the plurality of interconnected processors can be used to decision the information bits.

14. The decoder of claim 13 wherein the memory further comprises a random access memory (RAM) device.

15. The decoder of claim 14 wherein the plurality of interconnected nodes further comprise:

a plurality of variable nodes, at least one of the plurality of variable nodes operable to process an oldest intermediate LLR value from the circular buffer; and a parity-check node operable to supply a parity-check output LLR value to the circular buffer.

16. The decoder of claim 15 wherein the RAM device further comprises multi-port RAM.

17. The decoder of claim 16 further comprising a storage device to generate a predetermined plurality of addresses for reading and writing the intermediate LLR values.

18. The decoder of claim 17 wherein the storage device comprises a read only memory (ROM) device.

19. The decoder of claim 15 wherein the one of the plurality of interconnected processors is further adapted to implement memory partitioning within the RAM device.

20. The decoder of claim 19 further comprising a storage device to generate a predetermined plurality of addresses for reading and writing the intermediate LLR values to the RAM device.

21. The decoder of claim 20 wherein the storage device comprises a read only memory (ROM) device.

22. The decoder of claim 13 wherein the pointer moves to a next address in the circular buffer at a rate of one address per buad period.

23. The decoder of claim 13 wherein, at each time (t), the pointer defines an address in the circular buffer to which input LLR values for the at least one of the plurality of interconnected processors at the time (t) are written.

24. The decoder of claim 23 wherein the plurality of interconnected nodes further comprise a parity-check node adapted to:

read, at a time (t), a plurality of input LLR values from a plurality of addresses in the circular buffer defined by a plurality of predefined offsets from the address in the circular buffer defined by the pointer at the time (t);

process the plurality of input LLR values to provide a plurality of adjusted LLR values; and write the plurality of adjusted LLR values back to the same plurality of addresses in the circular buffer.

25. A method of processing information represented by arbitrary length blocks of low-density, parity-check codes, the method comprising:

passing a plurality of channel log likelihood ratio (LLR) values representing the information through a decoder comprising a plurality of processors;

alternately passing each of a plurality of intermediate LLR values through a variable node and a parity-check node, at least in part by storing the plurality of intermediate LLR values in and retrieving the plurality of intermediate LLR values from a memory device in each processor of the plurality of processors, wherein the memory device is adapted to store the plurality of intermediate LLR values in a circular buffer where a pointer tracks a current position in the circular buffer; and decisioning the information based on output LLR values from at least one of the plurality of processors.

26. The method of claim 25 wherein the storing of the plurality of intermediate LLR values in and the retrieving the plurality of intermediate LLR values from the memory device each further comprises accessing the circular buffer within the memory device.

27. The method of claim 26 wherein the accessing of the circular buffer further comprises applying an address generated by a storage device.

28. The method of claim 27 wherein the storage device is pre-programmed, changeable, read only memory (ROM).

29. The method of claim 25 wherein at least one of the storing of the plurality of intermediate LLR values and the retrieving of the plurality of intermediate LLR values further comprises applying an address generated by a storage device.

30. The method of claim 29 wherein the storage device is pre-programmed, changeable, read only memory (ROM).

31. The method of claim 25 wherein the pointer moves to a next address in the circular buffer at a rate of one address per buad period.

32. The method of claim 25 wherein, at each time (t), the pointer defines an address in the circular buffer to which input LLR values for the processor at the time (t) are written.

* * * * *